US009482710B2

(12) United States Patent
Agapiou et al.

(10) Patent No.: US 9,482,710 B2
(45) Date of Patent: Nov. 1, 2016

(54) INSPECTION SYSTEM FOR EVALUATING ELECTRICAL PARTS FOR UNWANTED PARTIAL DISCHARGE

(71) Applicant: GM GLOBAL TECHNOLOGY OPERATIONS LLC, Detroit, MI (US)

(72) Inventors: John S. Agapiou, Rochester Hills, MI (US); Thomas A. Perry, Bruce Township, MI (US); Jon Matthew Radlick, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 514 days.

(21) Appl. No.: 14/024,185

(22) Filed: Sep. 11, 2013

(65) Prior Publication Data

US 2015/0073733 A1    Mar. 12, 2015

(51) Int. Cl.
*G01R 31/00*    (2006.01)
*G01R 31/34*    (2006.01)
*G01R 31/12*    (2006.01)

(52) U.S. Cl.
CPC ......... *G01R 31/003* (2013.01); *G01R 31/1227* (2013.01); *G01R 31/343* (2013.01)

(58) Field of Classification Search
CPC .. G01R 31/003; G01R 31/02; G01R 31/021; G01R 31/06; G01R 31/343; G01R 31/12; G01R 31/1227; G01R 31/1272
See application file for complete search history.

(56) References Cited

U.S. PATENT DOCUMENTS

| 4,949,001 A | 8/1990 | Campbell |
| 5,475,312 A | 12/1995 | Sedding et al. |
| 2006/0022679 A1* | 2/2006 | Obata .................... G01R 31/06 324/551 |

* cited by examiner

*Primary Examiner* — Toan Le
(74) *Attorney, Agent, or Firm* — Mickki D. Murray, Esq.; Parks IP Law LLC

(57) ABSTRACT

An electrical part testing system for evaluating quality of an insulated electrical part, including a computer-controlled switching apparatus for providing an original voltage to the electrical part automatically according to a pre-established testing scheme calling for provision of voltage to each phase of the part, in turn, while grounding the other phases of the part. A high-frequency filter for receiving receive the original voltage, receiving a load voltage emanating from the electrical part in response to the part receiving the original voltage, and filtering the original voltage from the load voltage to isolate any partial-discharge voltage added to the original voltage by the electrical part while the part is being electrified by the original voltage, yielding a filtered signal. A computing device determines, based on a comparison of a peak amplitude of the partial-discharge inception voltage to a voltage threshold, the quality of the electrical part being tested.

17 Claims, 7 Drawing Sheets

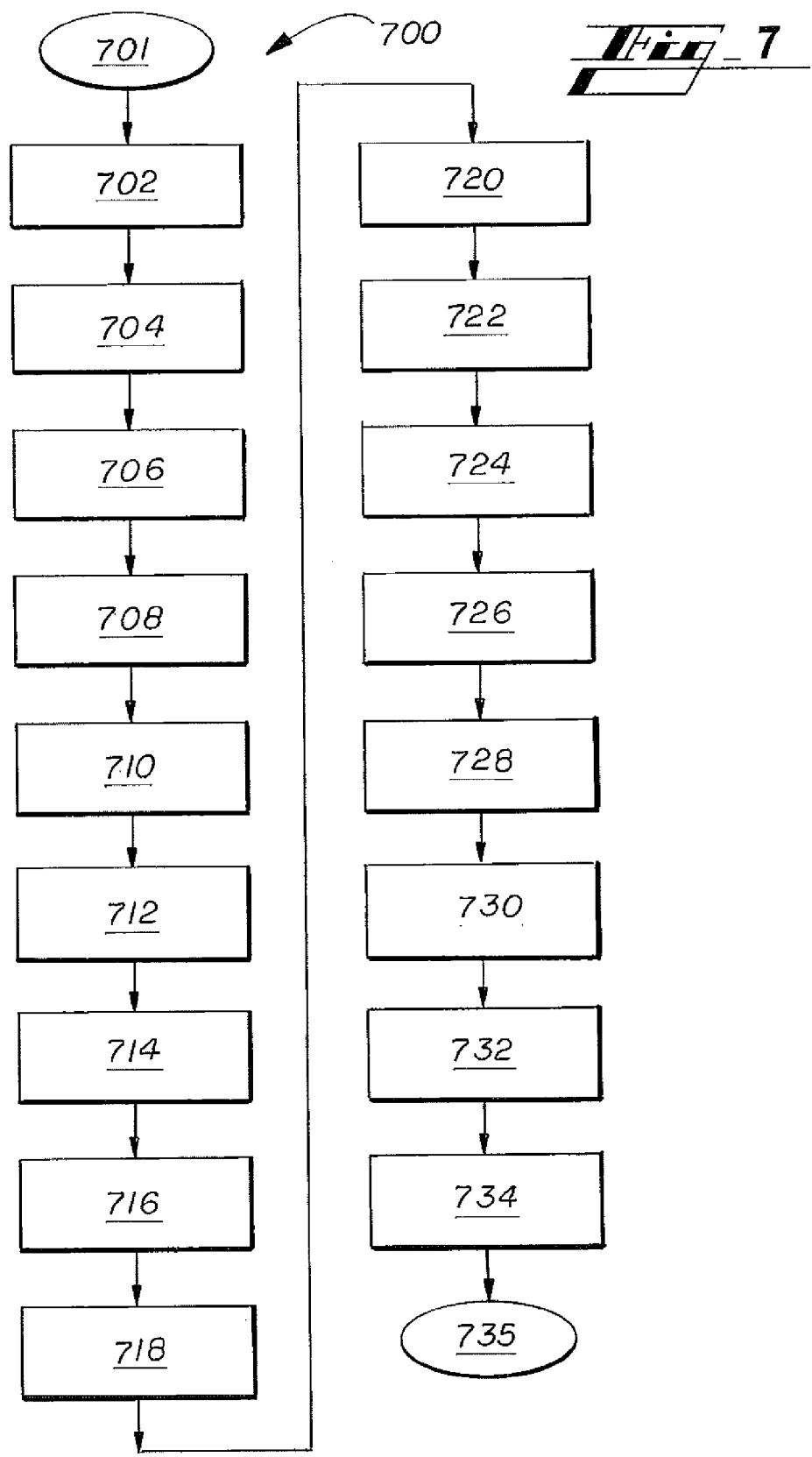

INSPECTION SYSTEM FOR EVALUATING ELECTRICAL PARTS FOR UNWANTED PARTIAL DISCHARGE

TECHNICAL FIELD

The present disclosure relates generally to an inspection system for evaluating electrical parts and, more particularly, to such systems, computer apparatus, methods, and algorithms for evaluating any unwanted partial discharge that may emanate from parts such as stators for electrical motors.

BACKGROUND

Many electrical parts include insulation, such as enamel or other primary insulation, close-coupled, or sheathed, over wires. Many also include a secondary insulation, such as a varnish provided over the sheathing.

When complete, the insulation keeps electrical current from emanating from the wire undesirably. When flaws are present in both layers, such as by the primary insulation being too thin in an area adjacent an air bubble in the secondary insulation, unwanted partial discharge (PD) can result. A PD can occur, for example, in such an air bubble.

Numerous challenges exist in identifying problematic flaws effectively and efficiently. A primary challenge is that traditional techniques require significant manual involvement, for instance, such as switching manually between phases of the electrical part being tested.

SUMMARY

The present disclosure relates to a multi-component, computer-controlled, system for evaluating electrical parts to determine whether each part exhibits unwanted partial discharge (PD).

The system includes an impulse voltage source, an automated switch, a high-frequency filter, a high-speed digitizer, and a computer controlling the switch and processing output of the filter.

More specifically, according to embodiments of the technology, the voltage source provides a fast-rise-time pulse voltage to input terminals of the automated switch as well as to input terminals of the high-frequency filter as a reference signal. The switch, under control of the computer, passes the pulse voltage selectively to the electrical part (e.g., stator) being tested.

Voltage output by the part is passed to the filter, which is configured to pass any frequency of the voltage from the part that differs from the frequency of the reference signal received from the voltage source. Any difference sensed is noise, and noise from a PD would have a very high frequency. Presence of such very high frequency oscillation, separated out by the filter, indicates an unwanted PD event, and thus that the part is flawed—e.g., has insufficient electrical insulation.

The digitizer, in one embodiment, has two channels, one connected to receive the filtered signal (e.g., noise). The other channel is connected to receive the original, or applied, signal (from the voltage source) after it is reduced by a voltage divider, or potential divider. The digitizer passes the peak amplitude of the filtered signal to the computer for analysis. The computer records the signals, compares the peak amplitude to a threshold value, and issues a pass or fail message corresponding to the part based on the comparison.

BRIEF DESCRIPTION OF THE DRAWINGS

FIG. 7 illustrates an exemplary method for automatically evaluating partial discharge in electrical parts, including at relatively-low surge voltages.

DETAILED DESCRIPTION

Figure 1:
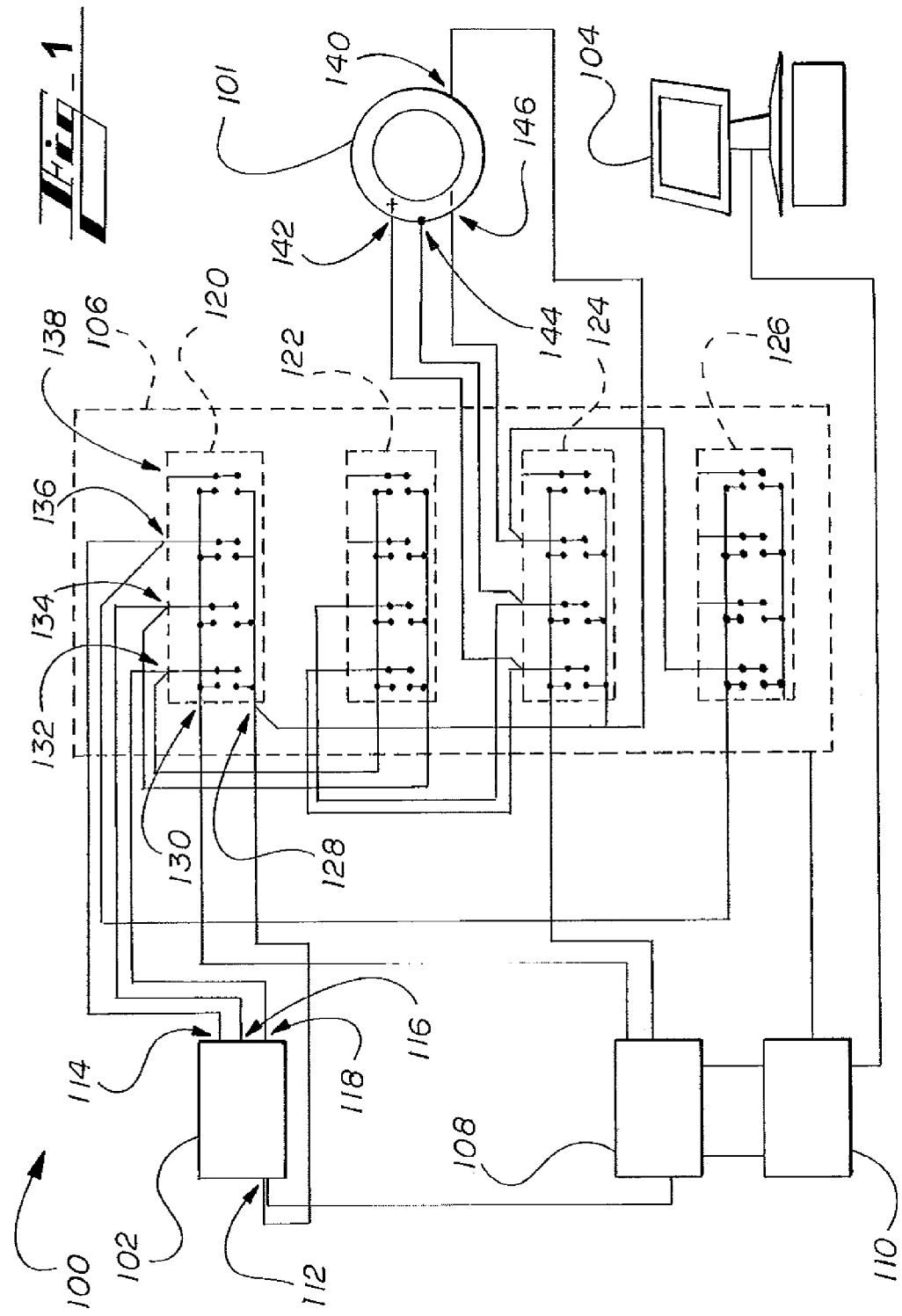
FIG. 1 illustrates a wire diagram of an evaluation system according to an embodiment of the present technology.

As required, detailed embodiments of the present disclosure are disclosed herein. The disclosed embodiments are merely examples that may be embodied in various and alternative forms, and combinations thereof. As used herein, for example, "exemplary," and similar terms, refer expansively to embodiments that serve as an illustration, specimen, model or pattern. Descriptions are to be considered broadly, within the spirit of the description. For example, references to connections between any two parts herein are intended to encompass the two parts being connected directly or indirectly to each other. As another example, a single component described herein, such as in connection with one or more functions, is to be interpreted to cover embodiments in which more than one component is used instead to perform the function(s). And vice versa—i.e., a description herein of multiple components in connection with one or more functions is to be interpreted to cover embodiments in which a single component performs the function(s). The figures are not necessarily to scale and some features may be exaggerated or minimized, such as to show details of particular components. In some instances, well-known components, systems, materials or methods have not been described in detail in order to avoid obscuring the present disclosure. Specific structural and functional details disclosed herein are therefore not to be interpreted as limiting, but merely as support for the claims and as representative bases for teaching one skilled in the art to employ the present disclosure.

I. Overview of the Technology

In various embodiments, the present disclosure describes an inspection system for evaluating any partial discharge emanating from electrical parts, such as electrical-motor stators, wiring, and controllers, and methods for performing the same.

In operation, because the system integrates multiple devices, each of which can be a sub-system, or at least receives input from one or more of the devices, it can in some instances be referred to as an integrated system. The integrated system includes, or receives input from, a high-frequency (HF) filter, an impulse surge source, or instrument, a computer-controlled, automated, switching apparatus, a high-speed digitizer, and a computer controller the automated operation of the switching apparatus.

As provided, the voltage source provides a fast-rise-time pulse voltage to input terminals of the automated switch as well as to an input terminal of the high-frequency filter as a reference signal. As part of the automated nature of the integrated system, the switching apparatus is controlled by the computer to provide, without manual intervention, the input pulse voltage to the part sequentially according to phases of part operation. While each phase is being tested, the other phases are grounded by the switch.

The filter passes any voltage from the part that has a higher frequency than the reference signal received from the voltage source on to the digitizer. High-frequency oscillations indicate a PD event at the part, and thus that the part is flawed—e.g., has insufficient electrical insulation.

A designer of the system can pre-establish desired system settings, such as applied voltage and the threshold noise amplitude, to define what severity of flaw and PD will be considered problematic, or at least suspect, in the testing.

When charged, wires having major flaws in its insulation—e.g., in both an enamel sheathing and a proximate varnish coating—tend to exhibit major partial discharge (PD), or PD inception voltage (PDIV). And larger flaws are more likely to discharge, and to discharge more, when exposed to a larger input, or surface, voltage during testing. The present system allows identification of what a designer considers a questionable flaw using much smaller surge voltage compared to traditional techniques. The system also identifies flaws that are much smaller, though perhaps still problematic or potentially problematic, than those detectible by traditional techniques. The automated, computer-controlled, nature of the switching apparatus allows more efficient and sensitive evaluation of parts without manual involvement.

II. Integrated PD Evaluation System—FIGS. 1 and 2

Turning now to the figures, and more particularly the first figure, FIG. 1 illustrates a wire diagram of the system 100. The system is configured for evaluating an electrical part 101. An example electrical part 101 for evaluation is a stator for use in an electrical motor, such as a bar-wound electric motor. PD events occur in the parts if insulation around wires of the part is damaged or otherwise insufficient.

As provided, the system 100 can be referred to as integrated because its components, or sub-systems, are integrated to perform the operations described herein. Components are interrelated, for instance, by the controller, e.g., computer, controlling connections among the components, and operation of at least some of the components (e.g., automated switch), for evaluating electrical parts in connection with each of multiple part phases sequentially in turn. One or more of the connections by which data is passed are in some embodiments wireless.

The components may in some embodiments be considered sub-systems, though one or more parts may be connected to the system. The system is in some implementations embodied as one or more kits. A kit in one implementation includes the automated switching apparatus. In another implementation, a kit includes the switch and a computer program to be executed at the controller for integrating system functions, including controlling switching of the automated switching apparatus. The system can be constructed from various kits, which can be packaged, sold, or otherwise provided separately.

With further reference to FIG. 1, the components integrated include the impulse surge instrument 102, the computing device 104, the automated switching device 106, the high-frequency filter 108, and the high-speed digitizer 110. Any connections needed according to embodiments herein and not shown in detail are considered shown inherently, or constructively, by the descriptions of the embodiments. The system 100 is described further below with reference in turn to each of these components 102, 104, 106, 108, 110.

II.A. Impulse Surge Instrument

The impulse surge instrument is identified in FIG. 1 by reference numeral 102. The instrument 102 is configured to provide a pulse voltage, at one or more desired voltage levels, for input to the electrical part 101 being tested. The instrument 102 may be referred to by other terms, such as a pulser, pulse instrument, impulse surge sub-system, source voltage sub-system, impulse instrument, voltage instrument, voltage source, simply as the source, or the like.

The surge instrument 102 is designed to provide a pulse voltage having a very short rise time. While the pulse may have other rise times without departing from the scope of the present technology, in one embodiment, the rise time of the pulse is about 80 nanoseconds (nsec), and can correspond to a frequency on the order of about 10 MHz. In another embodiment, the rise time is within a range of about 100 nsec to about 200 nsec. The very-high-rise-time voltage applied to the test part 101 may have a waveform like that generated by a variable-speed drive inverter (VSDI), such as a VSDI including an insulated-gate bipolar transistor (or, an IGBT-based VSDI).

The impulse surge instrument 102 includes a ground terminal 112. As shown in FIG. 1, the ground 112 is connected directly or indirectly to ground terminals of other system parts, such as of the test part 101, the automated switching apparatus 106, and the high-frequency filter 108.

The impulse surge instrument 102 also includes two or more voltage output terminals or ports 114, 116, 118. Each output terminal corresponds to one of the test part 101 phases. As shown in FIG. 1, three terminals 114, 116, 118 connect directly to the automated switching apparatus 106. In one embodiment, the terminals 114, 116, 118 correspond to three paths connecting the impulse surge instrument 102 to modules of the automated switching apparatus 106, as shown in FIG. 1. Interoperation of systems components including the critical computer-controlled operation of the switch 106 is described in further detail below.

The impulse surge instrument 102 can be single or multi-channel. The multi-channel version would include a channel corresponding to each phase in the test part 101. The single-channel version would provide output for each of the phases of the test part 101, in turn.

In a contemplated embodiment, the impulse surge instrument 102 is controlled at least in part by the controller 104. The controller 104 can be connected directly or, as shown in FIG. 1, indirectly to the impulse surge instrument 102. The controller 104 may control, for instance, what voltages the impulse surge instrument 102 outputs and at what timing.

An example impulse surge instrument 102 is an analyzer of the Advanced Winding Analyzer series, e.g., the AWA-IV product, developed by SKF Group, of Fort Collins, Colo., previously Baker Instrument Company.

II.B. Computing Structure and Select Functions—FIGS. 1 and 2

The computer device, or controller 104 includes at least one software program supporting operations of the present technology including, for instance, integrating operation of multiple system components 102, 106, 108, 110. The computer device 104 can be referred to by other terms, such as a controller sub-system, a computing sub-system, etc. The controller 104 can include any of the features described below in connection with the computer of FIG. 2, and in some embodiments includes features such as a micro controller, etc.

In one embodiment, the computer device 104 at least (a) controls switching of the switching apparatus 106, to provide impulse voltage from the impulse surge instrument 102 to the test part 101, according to a pre-defined sequence, and (b) analyzes signal characteristics associated with the voltage emanating from the test part 101. Other functions can include, e.g., (c) affecting provision of the impulse voltage from the impulse surge instrument 102 to the switching apparatus 106, such as by controlling a voltage level and/or a timing of the provision.

Figure 2:
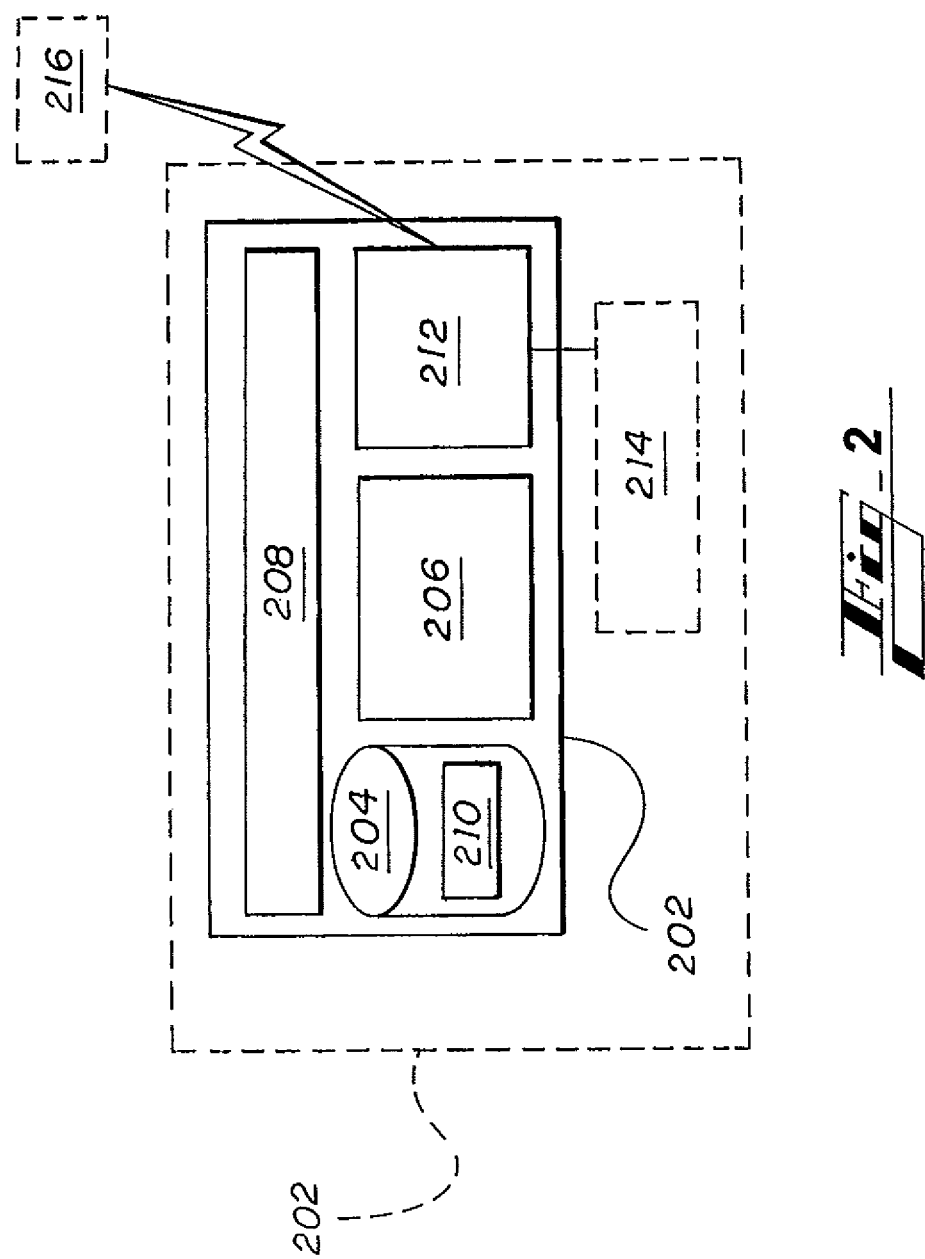
FIG. 2 illustrates schematically an example computing device for the system of FIG. 1, according to an embodiment of the present technology.

FIG. 2 illustrates schematically a configuration of the computer device 104, implemented as a computer 202 (or, computing device, processing apparatus, etc.) according to an embodiment of the present technology.

Though only one is shown, the computing device 202 includes one or more memories, or computer-readable media 204, such as a volatile medium, non-volatile medium, removable medium, or non-removable medium. The term computer-readable medium and variants thereof, as used in the specification and claims, refer to a tangible storage medium. The medium can be a device, and can be non-transitory.

The computer 202 also includes a computer processor 206 connected or connectable to the computer-readable medium 204 by way of a communication link 208, such as a computer bus.

The computer-readable medium 204 includes computer-executable instructions 210 executable by the computer processor 206 to perform all or any combination of the functions described herein.

The computer-executable instructions 210 can be arranged in one or more software modules, engines, or the like. The software engines can be referred to by the operation or operations that they cause the computer processor 206 to perform. For instance, an engine including instructions that, when executed by the processor 206, cause the processor to perform an operation of controlling operation of the automated switching apparatus 106 can be referred to as a switch-control engine, module, or the like. Similarly, a software engine of the instructions 210 causing the processor 206 to generate a chart of part output voltage versus input voltage can be referred to as a chart-generation, a voltage-chart, a PD-amplitude-chart engine or module, or similar. And a software engine causing the computer processor 206 to perform an operation of determining whether a peak amplitude of a post-part filtered signal is within a pre-set threshold can be referred to as a PDIV-analysis or PD-amplitude-analysis engine, module, etc.

The terms software engine, module, or variants thereof, are used expansively herein to include routines, program modules, programs, computer code, components, data structures, algorithms, and the like. Software engines can be implemented on various system configurations, including servers, network systems, single-processor or multiprocessor systems, minicomputers, mainframe computers, personal computers, hand-held computing devices, mobile devices, microprocessor-based, programmable consumer electronics, combinations thereof, and the like.

The computer processor 206 is connected or connectable to at least one interface 212 for facilitating communications, between the computer device 202 and local components 214, and/or between the computing device 202 and remote components 216. The interface 212 can include a transmitter, receiver, or transmitter that is wired and/or wireless-based for supporting wired and/or wireless protocol communications, respectively.

For communicating with the local and/or remote components 214, 216, the interface 212 can include one or both of wired connections and wireless components—e.g., transceiver, transmitter, and/or receiver. The local components 214 can include removable memories, or storage devices, local processors, or other local computing components, such as another local computing unit, such as a local server. The remote components 216 can include databases, remote servers, other processors, other storage mediums, and/or other computing devices.

Although shown as being a part of the computer device 202, completely, the interface 212, or any aspect(s) thereof, can be partially or completely a part of the device 202. The interface 212, or any aspect(s) thereof, can be partially or completely external to and connected or connectable to the computing device 202.

As provided, a function of the computer device 104 includes controlling switching of the automated switching apparatus 106. And the automated switching apparatus 106 control application of input voltage from the impulse surge instrument 102 to the test part 101, accordingly. The computer device 104, more particularly, instructs the automated switching apparatus 106 to control delivery of surge voltage to each of multiple phases of the part 101, in turn, according to a pre-set test sequence of controller logic (e.g., code 210). For parts to be used in a motor having three operational phases, for instance, the computer device 104 instructs the automated switching apparatus 106 to control application of the surge voltage to the test part 101 according to a three-phase test sequence wherein, while each phase is being tested, the other phases are grounded.

According to another referenced embodiment, a function of the computer device 104 includes controlling one or more functions of the impulse surge instrument 102, including voltage level provided and timing of the provision. The computer device 104 can be connected directly or, as shown in FIG. 1, indirectly to the surge subsystem 102 to affect this control.

II.C. Automated Switching Apparatus

As described, the automated switching apparatus 106 is controlled by the computer device 104 to transfer voltage, being at any of a variety of voltage levels, selectively to the test part 101. The apparatus 106 can be referred to by various terms, such as automatic switch, automated switching subsystem, computer-controlled switch, simply switch, or the like.

Generally, the automated switching apparatus 106 connects the impulse surge instrument 102 to the test part 101, and under the control of the computer device 104, controls provision of surge voltage phase-wise to each of various part phases, in turn, as required for successful evaluation of the test part 101.

The controller 104 can be connected directly or, as shown in FIG. 1, indirectly to the automated switching apparatus 106. The controller 104 controls, for instance, timing of the switching, between the part phases according to the appropriate phase-wise sequence.

The automated switching apparatus 106 provides impulse voltage from the impulse surge instrument to the test part 101 based on control input from the computing device 104. The control input includes a test sequence accommodating multiple phases of the electrical element (e.g., electrical motor) in which the test part 101 is to be used. For motors having three operation phases, for instance, the computing device 104 would control the automated switching apparatus 106 to in turn control provision of the impulse voltage to the test part 101 according to a three-phase sequence. The switch 106 is controlled to provide the impulse voltage to a first phase of the test part 101 while grounding the second and third phases in the test part 101, and then repeating for second phase (while grounding the first and third phases) and third phases (while grounding the first and second phases).

In one embodiment, the switching apparatus 106, under the control of the computer device 104, also controls connections among devices other than between the impulse surge instrument 102 and the test part 101, for proper testing of the part. The switching apparatus 106 is in one implementation controlled to provide the pulse voltage not only to the test part 101, selectively, but also to the high-frequency filter 108. In a contemplated implementation, the impulse voltage is provided to the filter automatically, without passing through the switch 106 or through the switch 106 but without being controlled.

As provided, the impulse surge instrument 102, can take any of various forms, including a single-channel surge system and a multi-channel surge system. The high-speed switching apparatus 106 is, in various embodiments, designed to be used with either or both of these forms. The single-channel instrument 102 provides via a single path voltage to the switch 106, which, under the control of the computer 104, controls passage of the voltage to the test-part phases according to the appropriate sequence (e.g., the voltage is provided to the connections for each of the phases, in turn, while the connections for the other phases are grounded). The multi-channel version of the instrument 102 includes multiple output channels, each corresponding to a phase of the test part 101. For the multi-channel pulser 102, then, the switch 106 is configured to receive input pulse voltage from each of the three pulser channels and still, under the control of the computer 104, control passage of the voltage to the test-part phases according to the appropriate sequence (e.g., the voltage is provided to the connections for each of the phases, in turn, while the connections for the other phases are grounded). In a contemplated embodiment, structure and functions of the impulse surge instrument 102 and the switching apparatus 106 are combined, such as being combined into a single voltage source/switching sub-system.

For implementations in which voltages provided are relatively high, the automated switching apparatus 106 can be referred to as a high-voltage (HV) automated switching apparatus. Example voltages are described further below in connection with the charts of FIGS. 3-6.

As shown in FIG. 1, the automated switching apparatus 106 includes numerous modules. While the switch 106 may include more or less modules, in the example of FIG. 1, the switch includes four modules 120, 122, 124, 126.

Each module includes multiple terminals, or ports. While the modules may include other terminals, in the example of FIG. 1, each 120, 122, 124, 126 includes six terminals—referenced in connection with the first module, by way of example, by numerals 128, 130, 132, 134, 136, and 138. Though discussed primarily herein in connection with common elements, e.g., the terminals, the modules of the automated switching apparatus 106 need not be identical.

The terminals 128, 130, 132, 134, 136, 138 include a ground terminal. In addition to being grounded, the ground terminal can be connected to the ground 112 of the impulse surge instrument 102, for instance, and/or other grounded elements. Similarly, the ground of each module can be connected, directly or indirectly, to the ground of the subject electrical test part. For instance, terminal 128 is shown connected indirectly to a ground 140 of the test part 101.

The terminals 128, 130, 132, 134, 136, 138 of each of the switch 106 also include one or more input and/or output terminals connecting the module directly or indirectly to the output terminals 114, 116, 118 of the impulse surge instrument 102 and to input terminals 142, 144, 146 of the test part 101.

Terminals of each module of the high-speed switching apparatus 106 can be connected to the impulse surge instrument 102 by way of various modules of the switch 106. In the example of FIG. 1, three terminals 132, 134, 136 are shown connected directly to terminals 114, 116, 118 of the impulse surge instrument 102 and as acting as a transfer for indirect provision of voltage to terminals of the other modules—e.g., from the perspective of the first module 120, to terminals of the other three illustrated modules 122, 124, 126.

In operation, the automated switching apparatus 106 is connected, directly or indirectly, to each phase of the part 101 via the terminals 142, 144, 146 of the test part 101. In the example of FIG. 1, the part 101 implemented as a stator operates in three phases, corresponding to three phases of the electric motor (not shown in detail) in which the stator will be used, and so has three corresponding terminals 142, 144, 146.

The automated switching apparatus 106 controls the surge voltage according to a test sequence corresponding to the multiple phases of the electrical apparatus (e.g., electrical motor) in which the test part is to be used. Again, then, for apparatus having three operation phases, the computer device 104 would control the automated switching apparatus 106 to control application of the surge voltage to the test part according to an appropriate three-phase sequence.

In one embodiment, the automated switching apparatus 106 does this by selectively closing a connection between itself and one of the phases of the test part 101 (i.e., between itself and one of the terminals 142, 144, 146 of the part) while grounding the other two phases of the test part, and repeating for each of the phases of the test part.

II.D. High-Frequency Filter

In operation, the high-frequency (HF) filter 108 receives a reference voltage from the impulse source 102 and post-test part voltage, and passes on only those frequencies received from the part that are sufficiently faster than the reference voltage. The filter 108, in other words, receives both voltages and rejects the original, reference, pulse, thereby filtering the reference voltage from the part-output voltage.

In one embodiment, the high-frequency filter 108 is configured to perform local operations including the following: (i) receiving an original pulse voltage matching that provided to the test part 101, or otherwise accessing data indicating such voltage (e.g., from a voltmeter or multimeter positioned between the source 102 and the part 101); (ii) receiving a resulting load voltage emanating from the test part, or otherwise accessing data indicating such voltage (e.g., from a voltmeter or multimeter positioned between the part 101 and the filter 108); and (iii) identifying, based on the original pulse and the resulting load voltage levels, any partial discharge (PD) voltage emanating from the part. The operations further include (iv) providing, to the high-speed digitizer 110, a signal including any PD voltage identified.

Further regarding the first operation (i), while it is preferred in the embodiments aforementioned that the high-frequency filter 108 receive the original, or applied, voltage, or a signal indicating the same, from the impulse surge instrument 102 or a measuring device positioned between the source 102 and the filter 108, in a contemplated embodiment the filter 108 receives the original voltage or a signal indicating the same from the switching apparatus 106 or a measuring device (e.g., voltmeter) positioned between the switch 106 and the filter 108.

Regarding the third operation (iii), any PD output voltage is identified by subtracting, or filtering, the original voltage (from the first operation (i)) from the load voltage (from the second operation (ii)). If there is no PD, there will be no appreciable noise, or difference, between the voltage input to and output from the part 101.

In other words, the filter passes on only those frequencies received from the part that are sufficiently faster than the original, or reference, pulse received directly from the impulse surge source, thereby filtering out, or rejecting, the original pulse. Essentially, any PD event would add a high-frequency noise on top of the pulse leaving the part.

Any difference sensed is noise, and noise from a PD would have a very high frequency—e.g., very high frequency voltage pattern. The frequency of PD noise may be, e.g., any frequency greater than about 50 MHz. Presence of such very high frequency oscillation, separated out by the filter, indicates an unwanted PD event, and thus that the part is flawed—e.g., has insufficient electrical insulation. In some implementations, the PD signal represents a voltage pattern having decaying oscillation and/or a decaying magnitude. While the PD signal may represent higher or lower frequencies, in one embodiment the frequency is about one-hundred megahertz (100 MHz).

In one embodiment, the high-frequency filter 108 includes an Iris Power PDA-IV, available from Iris Power LP, of Mississauga, Ontario, Canada, or related company, Qualitrol Company LLC, of Fairport, N.Y.

II.E. High-Speed Digitizer

The high-speed digitizer 110 can be referred to by other terms, such as a digitizing device, a digitizer sub-system, or simply a digitizer, for instance. In some embodiments, the digitizer is relatively high-speed, and so may be referred to as a high-speed digitizer.

Because a primary function of the digitizer 110 is to acquire and process data, it can be referred to as a data-acquisition device or sub-system, a data acquisition and high-speed digitizing sub-system, or similar. Because a primary function of the digitizer 110 is to analyze the data, it can be referred to as a high-speed analyzer, analyzing sub-system, or the like. Combining these functions, some embodiments of the digitizer can be referred to as a digitizing and analyzing device or sub-system, a high-speed digitizing-and-analyzing device or sub-system, etc.

In a first step (I) local to the digitizer 110, the digitizer receives the PD voltage signal transmitted from the high-frequency filter 108. In a second step (II), the high-speed digitizer 110 processes the PD voltage data received in the first step (I). In some embodiments, the processing includes analog-to-digital (ADC) processing, converting a received analog signal to a corresponding digital signal having generally the same data basis. In a third step (III), the digitizer 110 provides the processed signal to the controller 104.

As referenced, the digitizer 110, in one embodiment, has two channels. One is connected to receive the filtered signal—i.e., PD signal indicating any noise in the part-output, voltage. The other channel is connected to receive the original, or applied, signal. In a particular embodiment, the applied signal is received at the digitizer 110 after it is reduced by an inline voltage divider (not shown in detail). The digitizer 110 passes the peak amplitude of the filtered signal to the computing device 104 for analysis.

While the functions mentioned above in this sub-section are described primarily in connection with performance by the high-frequency filter 108, in a contemplated embodiment, one or more of the functions are performed by the computing device 104.

II.F. Other Computing Functions—FIGS. 1 and 3-7

As provided, functions of the computing device 104, in various embodiments, include instructing, or otherwise controlling, functions the automatic automated switching apparatus 106. In some embodiments, functions of the computing device 104 include instructing, or otherwise controlling, functions of the impulse surge instrument 102, such as a voltage level to provide to the switch 106 or by what timing.

Operations of the computing device 104 (e.g., processor executing an underlying program, or computer-executable instructions) also include receiving, from the digitizing high-speed digitizer 110, the processed (PD) signal, described above. The computing device 104 records the signal, compares the peak amplitude to a threshold value, and issues a pass or fail message corresponding to the part based on the comparison. The lowest pulse voltage at which the PD signal exceeds the prescribed threshold is deemed the Partial Discharge Inception Voltage, or, PDIV.

In a contemplated embodiment, the device 104 is configured to determine the quality by comparing the processed, digital, PDIV signal to one or more thresholds indicating two or more qualities. The thresholds can be pre-established, such as by a designer of the system 100 or operator thereof. The computing functions in some implementations further include recording, or storing, the data received, and storing data including the one or more thresholds.

In one embodiment, a single threshold is pre-set such that PD signals above the threshold (or at or above, depending on the threshold setting) are considered to have a poor, or at least suspect or questionable, quality, and PD signals below the threshold (or at or below, depending on the exact setting) are considered good.

As provided, the threshold can be set to correspond to any desired sensitivity. If a designer or operator of the system 100 would like to identify only highly-damaged parts 101, for instance, the threshold can be set relatively high. For a stricter review, a lower threshold would be used.

In a contemplated embodiment, the computing device 104 (e.g., the computer program, or computer-executable code) is configured to allow setting of a variable threshold. In a particular embodiment, the threshold can be set to vary based on variation in the input, surge, voltage. A varying threshold scheme can include, for example, at least one higher threshold in connection with at least one higher input voltage, and at least one lower threshold in connection with at least one lower input voltage. In one embodiment, the threshold scheme has a sliding scale, effectively, so that each increase in surge voltage above a certain amount (e.g., each increase of 100V surge) corresponds to a certain increase in the threshold, and each decrease in surge likewise corresponds to a decrease in the threshold. The relationship between surge increase and threshold need not be linear.

In one embodiment, whether the threshold is variable or static, the threshold is about 0.3 V (or, 300 millivolts (mV)) in connection with a surge, input, voltage up to about 1600 V.

The computing device 104 is configured to perform a notification function, such as by providing a signal, message, warning, alert, or other communication in connection with each part 101 exceeding a threshold. In some configurations, a corresponding signal, message, warning, etc., is provided for good parts as well.

III. Example Data Charts—FIGS. 3-6

FIGS. 3-6 illustrate results of exemplary testing of parts (e.g., stators), and considerations for analysis, according to teachings herein.

III.A. Applied and PD Voltage over Time—FIG. 3

Figure 3:
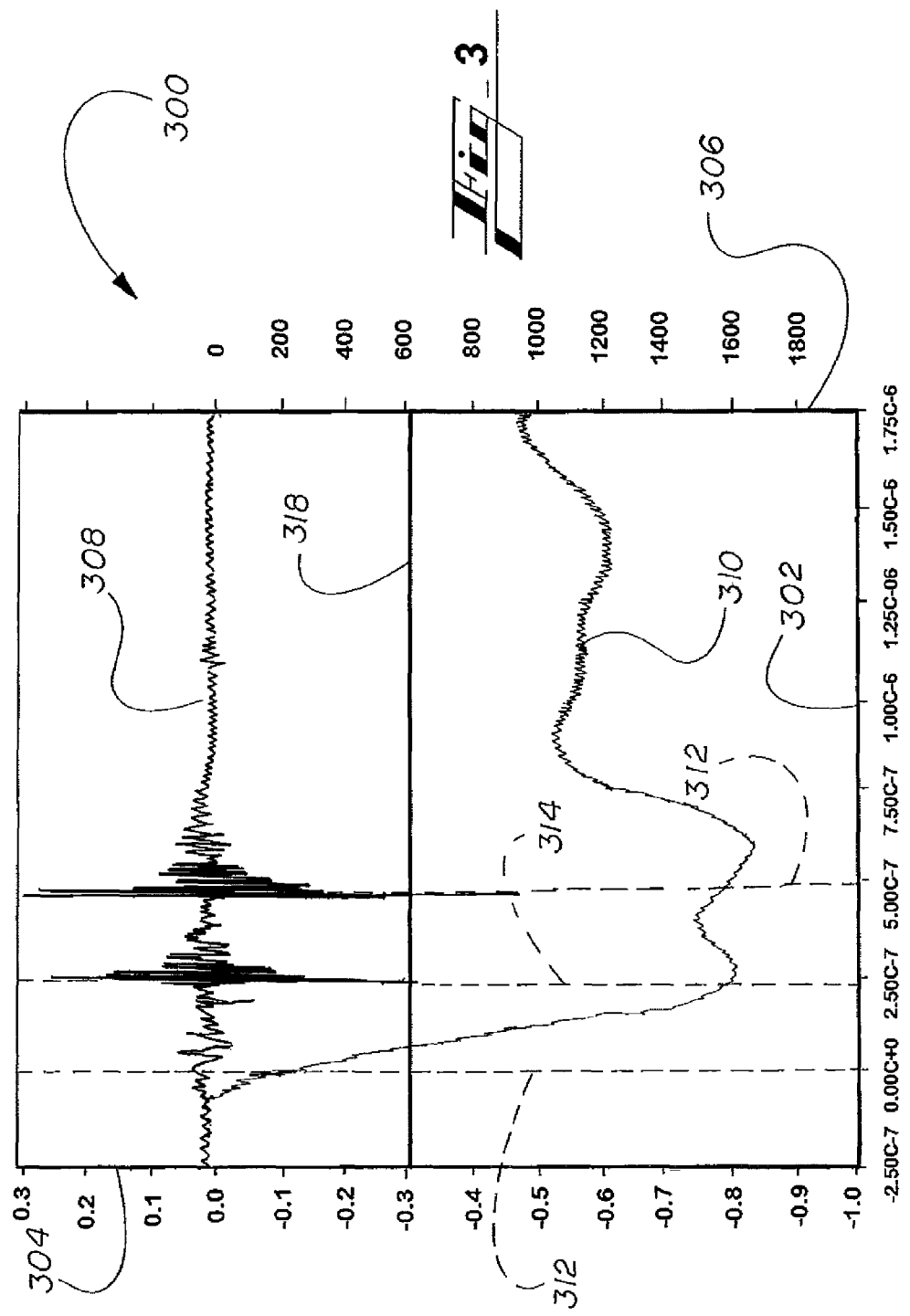
FIG. 3 is a chart representing surge voltage input to a test part and a resulting partial discharge inception voltage (PDIV) emanating from, or emitted by, the part over time.

FIG. 3 shows a chart 300 comparing partial discharge signal to surge voltage input to the part 101, according to an example testing of the present technology.

The chart 300 includes an x-axis 302 representing time measured in seconds. The first, left-side, y-axis 304 and the second, right-side, y-axis 306 both represent voltage, measured in volts (V). The left-side axis 304 shows increments of one-tenth of a volt, while the right-side axis 306 shows increments of two hundred volts. As described further below, the left-side y-axis 304 corresponds to display of levels of partial-discharge signal voltage—i.e., load voltage output by the test part 101). The right-side axis 306 is used for displaying applied voltage levels over time—i.e., levels of the original surge, or pulse, voltage provided to the test part 101 from the impulse surge instrument 102 and the high-frequency switching apparatus 106.

A first data line 308 represents amplitudes of PD signal received, at the computing device 104, from the high-speed digitizer 110. The data values of the first line 308 are thus presented, and to be interpreted, in connection with the first, left-side, y-axis 304. The values 308 can thus be seen to vary between about +/−0.33 volts.

The second data line 310 represents values of the surge pulse, input to the test part 101 from the impulse surge instrument 102 and the high-frequency switching apparatus 106. The data values of the second line 310 are thus presented, and to be interpreted, in connection with the second, right-side, y-axis 306. The values 310 can thus be seen to vary between 0 volts and about 1650 volts.

The surge voltage 310 is ramped down from zero volts starting at about a zero-seconds mark 312. As the surge voltage 310 is ramped, the PDIV 308 remains initially within a relatively-small range of relatively-low voltage, between about +/−0.1 mV. When, at about the 2.5 E−7 second mark 314, the magnitude of the surge voltage increases significantly, exceeding 1500 volts, the PD signal 308 spikes, exceeding 0.3 volts. The magnitude of the surge voltage is lowered shortly after that point 314, and the PDIV 308 again drops to the relatively-low range—e.g., between about +/−0.1 mV.

At a second surge ramp up, around a subsequent point 316 in time during the test, the surge voltage is again raised, to about 1650 volts. In response, the PD signal 308 again spikes, this time well above +/−0.3 volts, almost to about +/−0.5 volts.

FIG. 3 shows an example of a first threshold 318 pre-set to about +/−0.3 mV. Only the negative representation of the first threshold 318 is referenced, expressly—it should be appreciated that the positive counterpart lying on the very top edge of the chart 300. As also shown, PD signal for the part 101 being tested breaches the threshold 318 twice—at about the two latter marked points 314, 316 in time, corresponding to the two primary ramp ups of the applied voltage 310.

The electrical part 101 tested for the example implementations illustrated in the chart 300, thus, breaches the threshold twice, whether the flat or variable threshold is used. In this case, the computing device 104 would, accordingly, flag the part as a failure, or at least suspect.

III.B. PD vs. Applied Voltage for Phases of Various Parts—FIGS. 4-6

Figure 4:
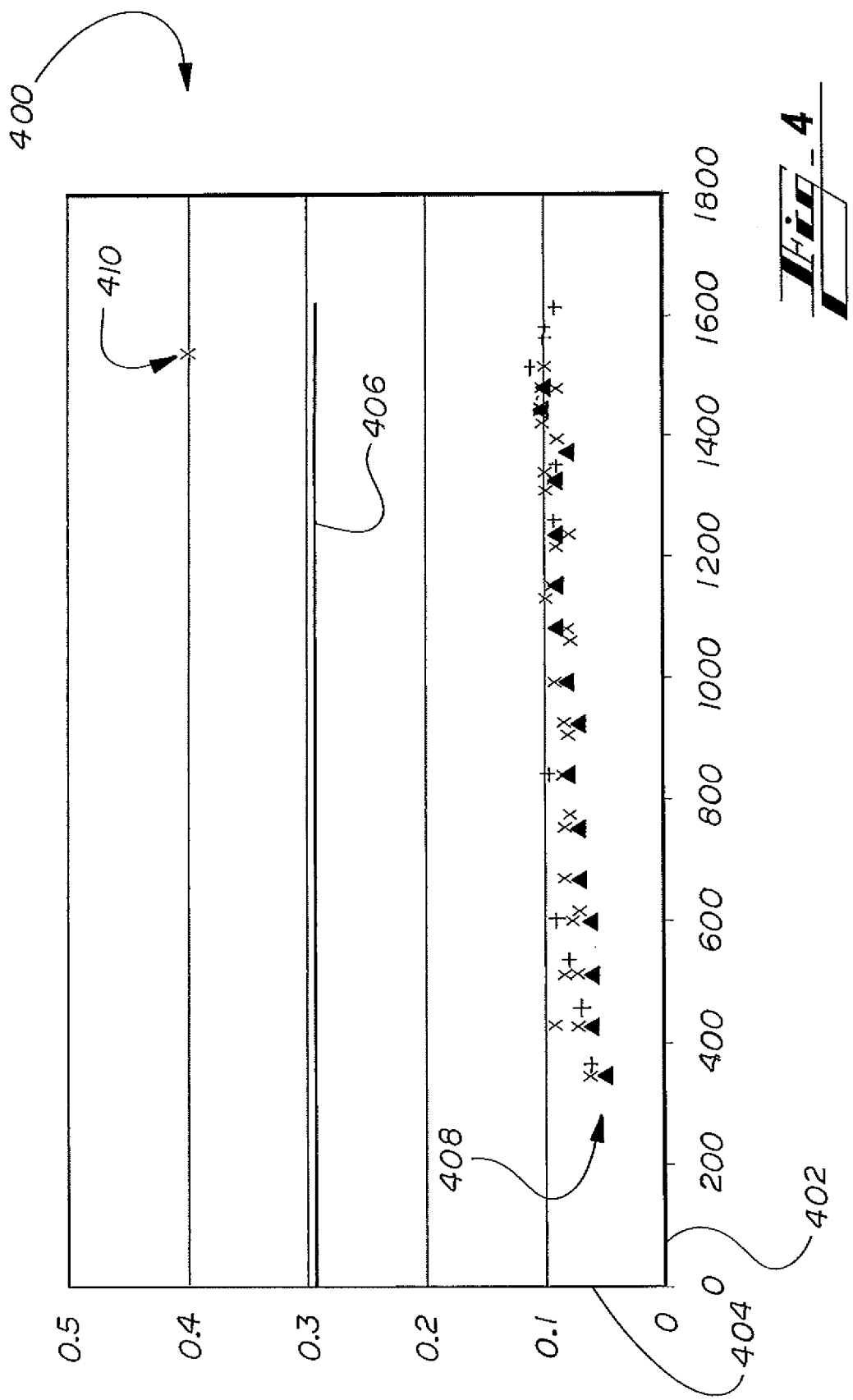
FIG. 4 is another type of chart representing PDIV emanating from numerous parts tested at the various surge, or input, voltages shown.
Figure 5:
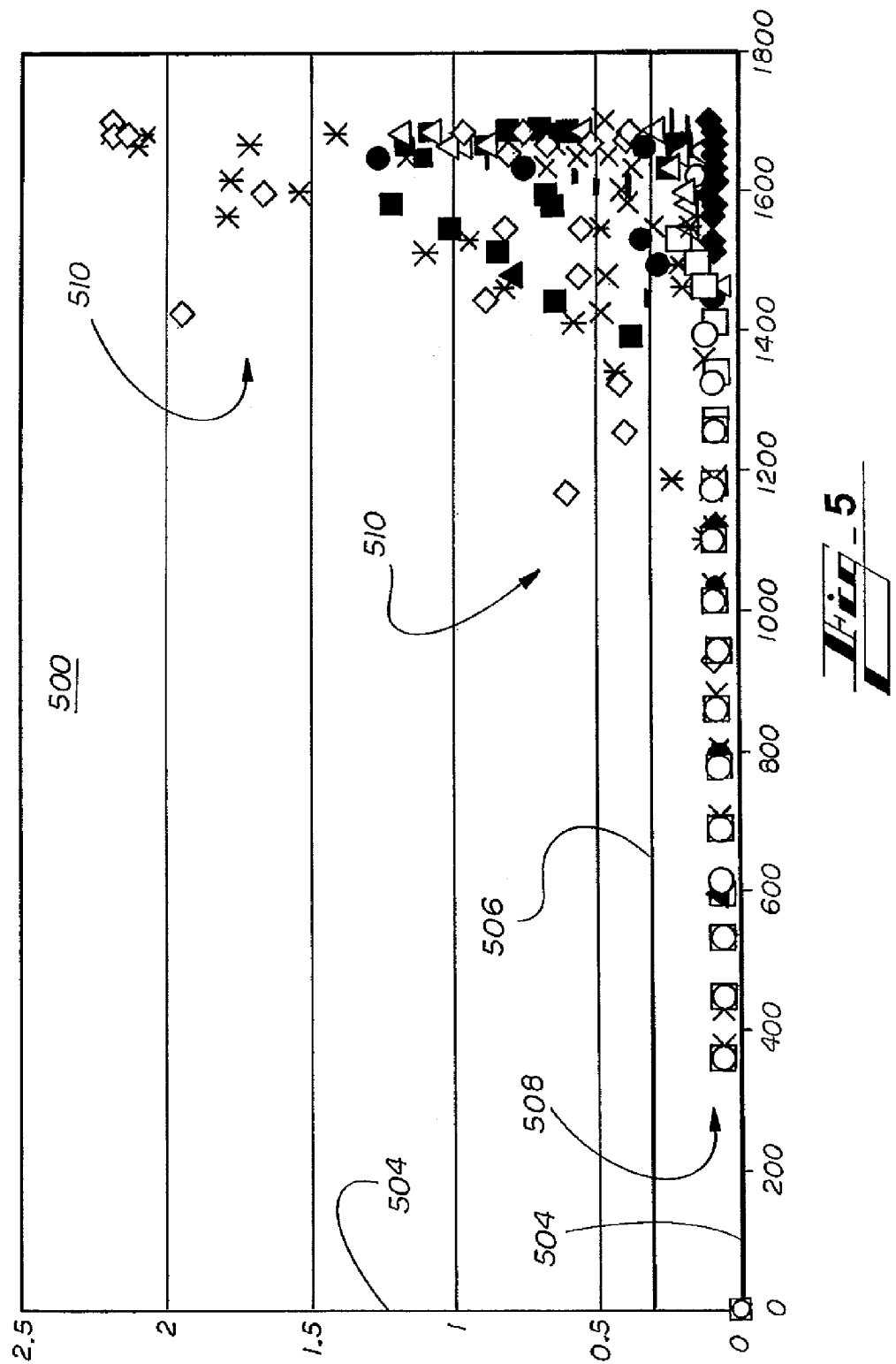
FIG. 5 is a second chart, like FIG. 4, representing PDIV emanating from numerous other parts tested at the various surge voltages shown.
Figure 6:
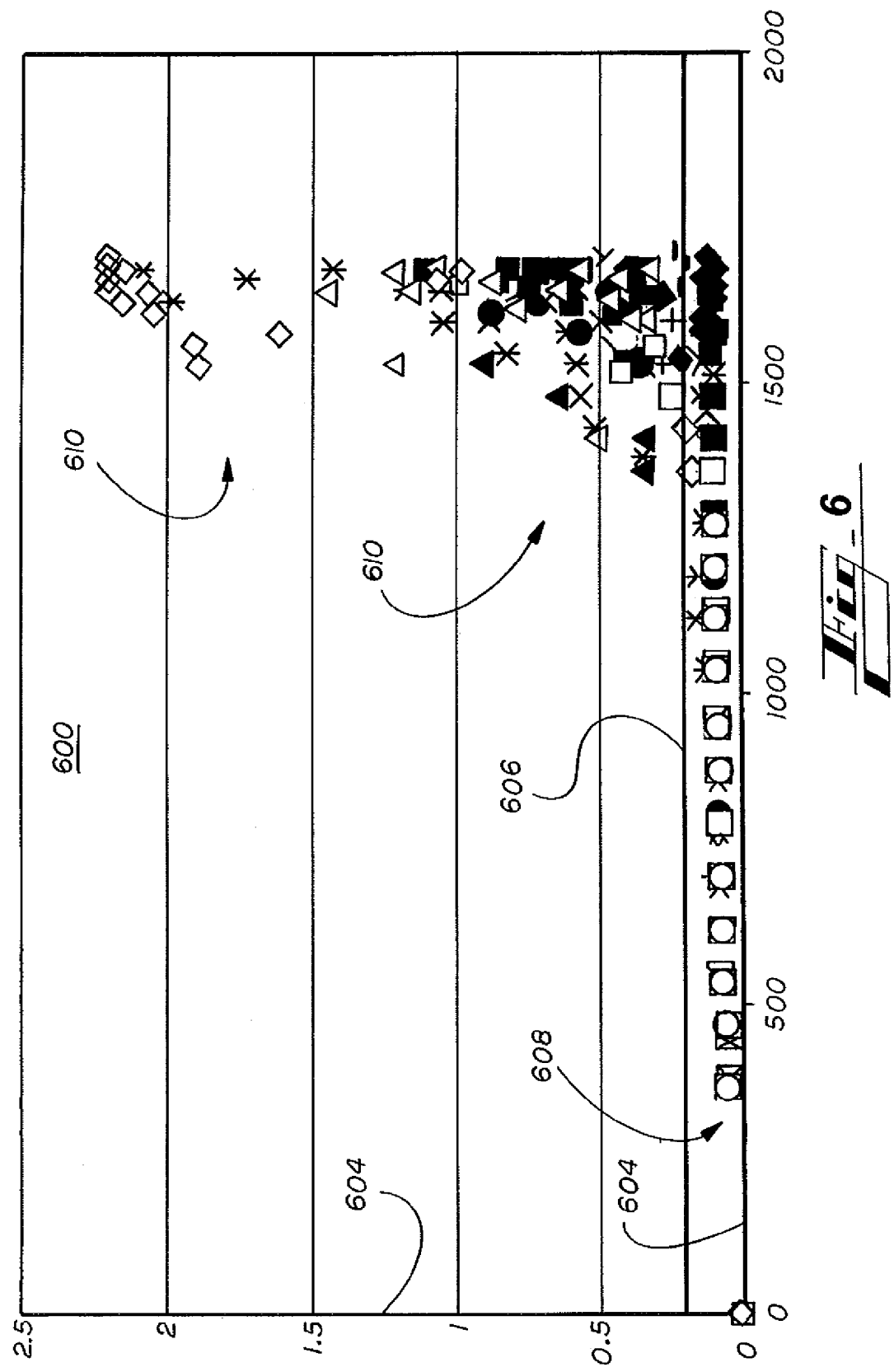
FIG. 6 is a third chart, like FIGS. 4 and 5, representing PDIV emanating from numerous other parts tested at the various surge voltages shown.

FIGS. 4-6 include charts 400, 500, 600 formatted differently than that of FIG. 3, but also showing test results. The results show, in connection with various applied voltages provided to test parts, levels of partial discharge voltage emanating from the parts, which levels are used to determine the partial discharge inception voltage (PDIV).

The charts 400, 500, 600 of FIGS. 4-6 show, simultaneously, data associated with the testing of various phases of numerous parts 101. Each of the charts 400, 500, 600 includes an x-axis 402, 502, 602, respectively, representing surge voltage. And each of the charts 400, 500, 600 includes a y-axis 404, 504, 604 representing peak PD signal emanating from the parts receiving the surge voltage. Each chart 400, 500, 600 also includes a PD threshold 406, 506, 606. By way of example, each PD threshold is set at about 0.3 volts. While a static threshold is shown, the threshold may be a varying type, as mentioned.

More particularly, each chart 400, 500, 600 includes data points representing PD-surge voltage resulting from testing the various operational phases of various parts 101. Each symbol (e.g., diamond, first triangle type, second triangle type, etc.) corresponds to results of testing a particular phase of one of various electrical parts. In FIG. 4, for instance, the plus symbol ('+') represents a first of three phases for a first example test part, the triangle represents a first of three phases for a second example test part, and the 'x' symbol represents a second phase for the second example test part (data for each phase of both of these example parts is not shown in FIG. 4).

As can be seen in the chart 400 of FIG. 4, a vast majority of the peak PD signals remain at relatively-low levels, well below the threshold 406, as the surge voltage is ramped up from zero to very high value, above 1500V. These data points are indicated by reference numeral 408 in FIG. 4.

It is only after the surge voltage is raised to about 1600V does only one of the parts tested for the chart 400 exhibit a PDIV above the threshold 406, as indicated by reference numeral 410. And, in this instance, the high data point 410 corresponds to only one phase for the one part—data points for other phases of the same part 101 are also shown and remain at the lower PD levels even above 1500V surge.

The chart 400 reveals that, according to the threshold 406 set for the test, all of the part/phase pairs were satisfactory except perhaps the one corresponding to the outlying point 410. The PDIV of this part would be classified as 1600V. Regarding the part/phase emitting the outlying PDIV 410, an operator of the system 100 can, noticing that the part/phase has breached the threshold, such as in reply to one of the alerts described above (e.g., light, tone, text), take any of a variety of actions.

The operator could, for instance, determine that that part is sufficiently insulated because the peak PD signal did not breach the threshold until the surge was ramped very high, e.g., above a certain level (e.g., 1400 or 1500V).

One of the benefits of the present technology is that parts 101 can be accurately evaluated for discharge at relatively-low surge voltages. It cannot be determined, for instance, whether a part 101 will likely perform well in actual operation based solely on how the part responds to a test voltage well above the voltage that the part will be exposed to in use.

As can be seen in the next chart 500, of FIG. 5, the peak PD signal remains at relatively-low levels as surge voltage is ramped up from zero to above 1000V. These data points are indicated by reference numeral 508.

Some of the part/phase data points begin to exceed the threshold as the voltage reaches about 1200V, and a large number of the part/phase data points exceed the threshold 506 as the voltage reaches about 1400V and above. These data points are called out by reference numeral 510 in FIG. 5.

Again, the operator's treatment of the test parts 101 can be based on a desired sensitivity, which can relate to a context of the testing—e.g., the type of part, the voltages to which the part will be exposed during operation, amount of low-level PD viewed as satisfactory, or PD being satisfactory as long as exhibited only when voltage is ramped above a certain level (e.g., 1000 mV), etc. If the parts shown in the example of FIG. 5 are expected not to exceed the threshold 606 for all surge voltages shown, then most of the parts tested would fail.

The results shown by the final chart 600, of FIG. 6, are similar to those described above for the previous chart 500.

IV. Algorithms and Methods of Operation—FIG. 7

FIG. 7 shows an exemplary method, 700 for evaluating partial discharge in an electrical part 101, such as a stator, automatically, according to embodiments of the present disclosure.

In certain embodiments, some or all steps of this process, and/or substantially equivalent steps are performed by a processor, e.g., computer processor, executing computer-executable instructions stored or included on a computer-readable medium, such as the memory 204 of the system 100 (e.g., controller 104) described above. The instructions can be arranged in a program configured according to a pre-established algorithm. Functions described herein in connection with one component can be performed by another component having corresponding structure for performing the functions. For instance, as referenced above, the controller can include structure for performing the digitizing functions, although the digitizing functions are described herein primarily in connection with the high-speed digitizer.

The illustrated method 700 is presented as a brief summary of the operations described above. For brevity, every operation is not described. Though details are provided in some cases, operations described are generally summarized, below—i.e., every detail of the operations described is not described. Any of the afore-mentioned operations, and details associated therewith, can be incorporated into the algorithm represented by the flow chart 700.

It should be understood that the steps of the method 700 are not necessarily presented in any particular order and that performance of some or all the steps in an alternative order is possible and is contemplated. The steps have been presented in the demonstrated order for ease of description and illustration. Steps can be added, omitted and/or performed simultaneously without departing from the scope of the appended claims. And it should also be understood that the illustrated method 700 can be ended at any time.

In certain embodiments, some or all steps of this process, and/or substantially equivalent steps are performed by, or at least initiated by a computing device, such as a processor executing computer-executable instructions stored or included at a computer-readable medium. And any one or more steps of the process can be performed, initiated, or otherwise facilitated by automated machinery, such as robotics.

With continued reference to the figures—and more particularly the seventh figures, the method 700 of FIG. 7 begins 701 and flow proceeds to block 702, whereat the computing device 104 transmits an instruction to the impulse surge instrument 102. At block 704, the impulse surge instrument 102 receives the same. The instruction is configured to cause the impulse surge instrument 102 to provide a pulse voltage at a desired level (i.e., one or more desired test voltage level).

In contemplated embodiments, the impulse surge instrument 102 is caused to provide the pulse voltage without instruction from the computing device—e.g., in response, instead, to an operator turning ON the source 102, the operator triggering a voltage-provision trigger (switch, button, etc.), or the source 102 sensing otherwise that it is time to provide the voltage, such as in response to a sensor advising the source 102 that the part has been connected to the automated switching apparatus 106.

At block 706, the computing device 104 transmits an instruction to the automated switching apparatus 106 advising how the current should be provided to the test part 101. More particularly, the instruction can provide to the automated switching apparatus a test sequence by which the current should be provided to the test part. The test sequence can relate to multiple phases of an electrical apparatus (e.g., electrical motor) in which the test part (e.g., stator) is to be used—e.g., a three-phase sequence for a three-phase part.

At block 708, the automated switching apparatus 106 provides the voltage to the test part 101 according to the instruction received from the computing device 104, such as by providing the voltage to one (e.g., a first) of multiple phases (e.g., three phases) of the part 101, while grounding the other (e.g., second and third phase) of the multiple phases, for a time period, and then repeating with respect to each of the other (second and third) of the multiple phases. The provision of voltage to the part 101 (e.g., steps 702-708) can be repeated with different surge voltages, such as in separate test runs or in ramping up the surge voltage in a test run.

At block 710, the high-frequency filter 108 receives the load voltage, output from the test part 101, or a signal indicating the voltage, such as from a voltmeter. At block 712, the high-frequency filter 108 receives the surge voltage, such as from the impulse surge instrument 102. At block 714, the high-frequency filter 108 may store data representing the voltage data received.

As provided, while operations of the present method 700 are presented in a demonstrated order for ease of description and illustration, operations can be added, omitted and/or performed simultaneously without departing from the scope of the appended claims. Thus, for instance, while some steps are shown serially, any of them may be performed in parallel, and/or their order of performance different than as shown in the example of FIG. 7.

At block 716, the high-frequency filter 108 determines whether there is any appreciable noise in the load voltage output from the part 101. As described above, the filter 108 does this by filtering the original pulse from the load voltage. In this way, only noise will remain. Noise corresponding at or exceeding a certain threshold is considered partial discharge inception voltage (PDIV) associated with a PD event at the part 101.

At block 718, the filter 108 provides the PD signal to the high-speed digitizer 110. At block 720, the digitizer 110 processes the received signal, including analog-to-digital (ADC) processing, converting a received analog signal to a corresponding digital signal having generally the same data basis.

At block 722, the digitizer 110 passes, to the computing device 104 for analysis, a signal indicating a peak amplitude of the filtered signal.

At block 724, the computing device 104 receives the processed signal from the digitizer. At block 726, the stage can include recording, or storing, the data. At block 728, the computing device 104 compares the peak value(s) of the processed PD signal to one or more thresholds indicating two or more qualities, as described above. At block 730, the computing device 104 determines, based on the comparing 728, a quality of the part 101. The determination includes determining whether the peak value(s) of the processed PD signal meets (or exceeds, depending on the threshold(s) set) one or more thresholds indicating two or more qualities, as described above.

The computing device 104 at block 730 issues a pass or fail message, accordingly. The computing device 104 at block 732 determines a notification, or alert, corresponding to the results (728, 730). The notification can include a signal or message for interpretation by another part of the system 100 or other automated structure such as a robot that moves the part to a bin or conveyor corresponding to the part quality determined—e.g., passing bin or belt, or suspect bin or belt, etc. The notification can also include providing a warning or alert if the part 101 exceeds a threshold. And the alert can include, for instance, a signal causing a light to illuminate, an audible alarm to sound, display or other transmission of a textual message, etc. The actions could also include, for parts determined damaged or likely damaged, repair, reconstruction, or recycling. The computing device 104 at block 734 provides, or initiates provision of, the notification or alert determined at block 732. At oval 735, the method 700 can end or be repeated.

V. Select Advantages and Benefits

One important benefit of the present technology is that, by using a computer-controlled automated switching device and a high-frequency filter, the system allows more sensitive evaluation of partial discharge (PD) as compared to conventional techniques.

The automated switch also eliminates the need for tedious, costly, and impractical option of manual switching.

As another benefit, the technology can be incorporated relatively easily for use in evaluating a wide variety of electrical parts having insulated wire, such as stators for bar-wound electric motors.

VI. Conclusion

Various embodiments of the present disclosure are disclosed herein. The disclosed embodiments are merely examples that may be embodied in various and alternative forms, and combinations thereof. The law does not require and it is economically prohibitive to illustrate and teach every possible embodiment of the present technology. Hence, the above-described embodiments are merely exemplary illustrations of implementations set forth for a clear understanding of the principles of the disclosure. Variations, modifications, and combinations may be made to the above-described embodiments without departing from the scope of the claims. All such variations, modifications, and combinations are included herein by the scope of this disclosure and the following claims.

What is claimed is:

1. An electrical part testing system, for evaluating quality of an insulated electrical part, comprising:
a computer-controlled switching apparatus configured and arranged to:
receive, from a computing device, a pre-determined testing scheme corresponding to the electrical part;
receive, from a voltage source, an original voltage having a pre-determined voltage level; and
provide the original voltage to the electrical part automatically according to the pre-established testing scheme;
a high-frequency filter configured and arranged to:
receive the original voltage;
receive a load voltage emanating from the electrical part in response to the part receiving the original voltage; and
filter the original voltage from the load voltage to isolate any partial-discharge inception voltage added to the original voltage by the electrical part while the part is being electrified by the original voltage, yielding a filtered signal; and
the computing device being configured and arranged to:
receive, from the high-frequency filter, the filtered signal;
compare a peak amplitude of the filtered signal to a voltage threshold, in a comparison; and
determine, based on the comparison, the quality of the electrical part being tested.

2. The system of claim 1, wherein:
the system further comprises a high-speed digitizer configured to:
receive, from the high-frequency filter, the filtered signal indicating any partial-discharge voltage isolated by the filter; and
convert the filtered signal to a digital-format, yielding filtered-and-processed signal; and
the computing device, in being configured and arranged to receive the filtered signal, is configured and arranged to receive the filtered-and-processed signal, having been filtered by the filter and processed by the digitizer.

3. The system of claim 1, wherein:
the system further comprises a voltage divider linked between the voltage source, being an impulse surge instrument, and the digitizer; and
the digitizer is configured to receive, from the voltage divider, the original voltage having been reduced by the divider.

4. The system of claim 1, wherein:
the electrical part has either three phases or five phases; and
the testing scheme, received by the computer-controlled switching apparatus, corresponds to the electrical part at least by being a three-phase testing scheme, if the part has three phases, and a five-phase testing scheme if the part has five phases.

5. The system of claim 1, wherein the original voltage, having the pre-determined voltage level, has a rise time between about 100 nanoseconds and about 200 nanoseconds.

6. The system of claim 1 wherein:
the receiving, comparing, and determining are computer-implemented operations; and
the computing device, in being configured and arranged to perform the receiving, comparing, and determining, comprises a computer-readable medium having computer-executable instructions that, when executed by a processor, cause the process to perform the receiving, comparing, and determining operations.

7. The system of claim 6, wherein the computing device further comprises the processor.

8. The system of claim 6, wherein the computer-executable instructions are further configured to cause the processor to generate and send, to the switching apparatus, an instruction signal comprising the testing scheme.

9. The system of claim 1, wherein:
the testing scheme includes a multi-phase procedure, pertaining to multiple phases of the electrical part being evaluated, by which the original voltage is to be applied, by the switching apparatus, to a first terminal of multiple part terminals, corresponding to multiple phases of the part, while each other terminal of the multiple part terminals is grounded, and this is repeated for each of the phases; and the computing device is configured to perform the receiving and comparing with respect to each phase, wherein the computing device determines that the part has a low quality if the peak amplitude of partial-discharge voltage associated with any part phase exceeds the voltage threshold.

10. The system of claim 1, wherein the threshold is determined to vary, as a function of the amplitude of the applied voltage pulse, over time during a test period during which the electrical part is evaluated.

11. A method, for evaluating quality of an insulated electrical part, comprising:
receiving, by the switching apparatus, from a computing device, an instruction signal indicating a pre-determined testing scheme corresponding to the part, the original voltage to the electrical part being tested;
receiving, by a switching apparatus, an original voltage to be provided to the electrical part being tested;
providing, by the switching apparatus, in accord with the pre-determined testing scheme;
receiving, by the computing device, from high-frequency filter partial-discharge-inception-voltage signal indicating a peak amplitude; and
determining, by the computing device, whether the part is good by comparing the peak amplitude to a threshold;
wherein the partial-discharge-inception-voltage signal is a filtered signal prepared by:
receiving, by the high-frequency filter, from the voltage source, being an impulse surge instrument, the original voltage;
receiving, by the high-frequency filter, a load voltage emanating from the electrical part in response to the part receiving the original voltage from the switching apparatus; and
filtering, by the high-frequency filter, the original voltage from the load voltage to isolate any partial-discharge inception voltage added to the original voltage by the electrical part while the part is being electrified by the original voltage, yielding the filtered signal.

12. The method of claim 11, further comprising:
receiving, by a high-speed digitizer, from the high-frequency filter, the filtered signal; and
converting, by the digitizer, the filtered signal to a digital-format, yielding a filtered-and-processed signal;
wherein receiving, by the computing device the filtered signal comprises receiving the filtered-and-processed signal, having been filtered by the filter and processed by the digitizer.

13. The method of claim 11, wherein:
the electrical part includes multi-phases;
the testing scheme includes a multi-phase procedure, pertaining to multiple phases of the electrical part, by which the original voltage is to be applied, by the switching apparatus, to a first terminal of multiple part terminals, corresponding to multiple phases of the part, while each other terminal of the multiple part terminals is grounded, and this is repeated for each of the phases;
determining, by the computing device, whether the part is good includes comparing, to the threshold, peak amplitudes received in connection with each phase of the procedure; and
the computing device determines that the part has a low quality if the peak amplitude associated with any part phase exceeds the voltage threshold.

14. The method of claim 13, wherein:
the electrical part is configured according to a three-phase operational basis; and
the testing scheme corresponds to the electrical part at least by being a three-phase testing scheme.

15. The method of claim 11, wherein the threshold varies over time during a test period during which the electrical part is evaluated.

16. A non-transitory computer-readable storage device comprising a computer-readable medium having computer-executable instructions that, when executed by a processor, cause the processor to perform operations, for evaluating quality of an insulated electrical part, comprising:
providing, to an automated switching apparatus, an instruction signal including a testing scheme, wherein the scheme:
corresponds to multiple phases of the electrical part being evaluated; and
instructs the switching apparatus on a manner by which to provide an original voltage selectively to the part, including to provide the original voltage to a first phase, of the multiple phases of the part, while grounding other phases, of the multiple phases of the part, and to repeat for each phase;
receiving, from a high-speed digitizer, a filtered-and-processed signal indicating a peak amplitude of a partial-discharge inception voltage emanating from the part while the part is being electrified by the original voltage; and
determining whether the part is good by comparing, to a threshold, the peak amplitude received in connection with each phase of the part.

17. The non-transitory computer-readable storage device of claim 16, wherein:
the operations are performed during a test period; and
threshold varies over time during the test period.

* * * * *